US009218279B2

(12) United States Patent  (10) Patent No.: US 9,218,279 B2
Tomlin et al.  (45) Date of Patent: Dec. 22, 2015

(54) ATOMIC WRITE COMMAND SUPPORT IN A SOLID STATE DRIVE

(71) Applicants: Western Digital Technologies, Inc., Irvine, CA (US); Skyera, LLC, San Jose, CA (US)

(72) Inventors: Andrew J. Tomlin, San Jose, CA (US); Justin Jones, Burlingame, CA (US); Rodney N. Mullendore, San Jose, CA (US)

(73) Assignees: Western Digital Technologies, Inc., Irvine, CA (US); Skyera, LLC, San Jose, CA (US)

( * ) Notice: Subject to any disclaimer, the term of this patent is extended or adjusted under 35 U.S.C. 154(b) by 183 days.

(21) Appl. No.: 13/895,016

(22) Filed: May 15, 2013

(65) Prior Publication Data

US 2014/0281145 A1    Sep. 18, 2014

Related U.S. Application Data

(60) Provisional application No. 61/793,513, filed on Mar. 15, 2013.

(51) Int. Cl.
  *G06F 3/06*    (2006.01)
  *G06F 12/02*   (2006.01)
  *G06F 9/46*    (2006.01)
  *G11C 16/10*   (2006.01)

(52) U.S. Cl.
  CPC .......... *G06F 12/0246* (2013.01); *G06F 3/0688* (2013.01); *G06F 9/466* (2013.01); *G06F 2212/7201* (2013.01); *G11C 16/10* (2013.01)

(58) Field of Classification Search
  None
  See application file for complete search history.

(56) References Cited

U.S. PATENT DOCUMENTS 6,052,763 A   4/2000 Maruyama
6,856,556 B1  2/2005 Hajeck
(Continued)

FOREIGN PATENT DOCUMENTS

JP     2007-004798     1/2007
KR  10 02006 0127015   12/2006

OTHER PUBLICATIONS

Ouyang et al. (Beyond Block I/O: Rethinking Traditional Storage Primitives; published Feb. 12-16, 2011, ISBN: 978-1-4244-9432-3; pp. 301-311).*

(Continued)

*Primary Examiner* — Kaushikkumar Patel
(74) *Attorney, Agent, or Firm* — Wilmer Cutler Pickering Hale and Dorr LLP

(57) ABSTRACT

A method of performing an atomic write command in a data storage device comprising a volatile memory and a plurality of non-volatile memory devices configured to store a plurality of physical pages. The method may comprise storing data in a plurality of logical pages (L-Pages), each associated with a logical address. A logical-to-physical address translation map may be maintained in the volatile memory, and may be configured to enable determination of a physical location, within one or more of the physical pages, of the data referenced by each logical address. The data specified by a received atomic write command may be stored one or more L-Pages. Updates to the entry or entries in the translation map associated with the L-Page(s) storing the data specified by the atomic write command may be deferred until all L-Pages storing data specified by the atomic write command have been written in a power-safe manner.

39 Claims, 12 Drawing Sheets

(56) References Cited

U.S. PATENT DOCUMENTS

| | | |
|---|---|---|
| 7,126,857 B2 | 10/2006 | Hajeck |
| 7,389,308 B2 | 6/2008 | Bailey |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,103,910 B2 | 1/2012 | Blumrich et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,219,741 B2 | 7/2012 | Condit et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,370,603 B2 | 2/2013 | Toelkes et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2006/0155931 A1 | 7/2006 | Birrell et al. |
| 2006/0179211 A1 | 8/2006 | Aasheim et al. |
| 2008/0320245 A1 | 12/2008 | Tomlin et al. |
| 2009/0193193 A1* | 7/2009 | Kern ............................ 711/128 |
| 2010/0161886 A1 | 6/2010 | Toelkes et al. |
| 2010/0174849 A1 | 7/2010 | Walston et al. |
| 2010/0250793 A1 | 9/2010 | Syu |
| 2011/0099323 A1 | 4/2011 | Syu |
| 2011/0283049 A1 | 11/2011 | Kang et al. |
| 2012/0030408 A1 | 2/2012 | Flynn et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0013980 A1 | 1/2013 | Cideciyan et al. |
| 2013/0073821 A1 | 3/2013 | Flynn et al. |
| 2013/0091331 A1* | 4/2013 | Moraru et al. ................ 711/143 |
| 2013/0097369 A1 | 4/2013 | Talagala et al. |
| 2013/0132638 A1 | 5/2013 | Horn et al. |
| 2013/0145106 A1 | 6/2013 | Kan |
| 2013/0212318 A1 | 8/2013 | Toelkes et al. |
| 2013/0219119 A1 | 8/2013 | Galbraith et al. |
| 2013/0227236 A1 | 8/2013 | Flynn et al. |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0143476 A1* | 5/2014 | Sela et al. ..................... 711/103 |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0195852 A1 | 7/2014 | Gollub et al. |
| 2014/0223255 A1 | 8/2014 | Lu et al. |
| 2014/0281145 A1 | 9/2014 | Tomlin et al. |
| 2014/0317337 A1 | 10/2014 | Puthiyedath et al. |
| 2014/0325125 A1 | 10/2014 | Kwon et al. |

OTHER PUBLICATIONS

Fusion-io, Press Release, "Reference Architecture for Improving Performance in Enterprise Databases and Applications with New Flash-Powered Features to Support the MySQL Community", Oct. 4, 2011, 2 pages.

Ho-Fan Kang, et al., U.S. Appl. No. 13/173,431, filed Jun. 30, 2011, 14 pages.

International Search Report and Written Opinion dated Jul. 10, 2014 from related PCT Serial No. PCT/US2014/024303, 9 pages.

James J. Walsh, et al., U.S. Appl. No. 14/060,547, filed Oct. 22, 2013, 53 pages.

Office Action dated Jan. 12, 2015 from U.S. Appl. No. 14/060,547, 6 pages.

Notice of Allowance dated Apr. 28, 2015 from U.S. Appl. No. 14/060,547, 5 pages.

* cited by examiner

| | |
|---|---|
| 10001 | Slot No. 1 |
| 10005 | Slot No. 2 |
| 10002 | Slot No. 3 |
|  | Slot No. 4 |
| 10003 | Slot No. 5 |
| 10004 | Slot No. 6 |

Next Seq. No. 10006

*FIG. 15A*

| | |
|---|---|
| 10001 | Slot No. 1 |
| 10005 | Slot No. 2 |
| 10002 | Slot No. 3 |
| 10006 | Slot No. 4 |
| 10003 | Slot No. 5 |
| 10004 | Slot No. 6 |

*FIG. 15B*

| | |
|---|---|
| 10001 | Slot No. 1 |
| 10005 | Slot No. 2 |
| 10002 | Slot No. 3 |
| 10006 | Slot No. 4 - Blocked |
| 10003 | Slot No. 5 |
| 10004 | Slot No. 6 |

Next Seq. No. 10007

*FIG. 15C*

| | |
|---|---|
| 10001 | Slot No. 1 |
| 10005 | Slot No. 2 |
| 10002 | Slot No. 3 |
| 10006 | Slot No. 4 |
| 10007 | Slot No. 5 |
| 10004 | Slot No. 6 |

*FIG. 15D*

| SEQ. NO. | MIN | MAX |
|---|---|---|
| SEQ. NO. N | FFFFF | 0 |
| SEQ. NO. N+1 | FFFFF | 0 |
| SEQ. NO. N+2 | FFFFF | 0 |
| SEQ. NO. N+3 | FFFFF | 0 |
*FIG. 16A*
PARTIALLY COMPLETED ATOMIC WRITE - SEQ. NO. N
LPN 101
LPN 103
| SEQ. NO. | MIN | MAX |
|---|---|---|
| SEQ. NO. N | LPN 100 | LPN 100 |
| SEQ. NO. N+1 | FFFFF | 0 |
| SEQ. NO. N+2 | FFFFF | 0 |
| SEQ. NO. N+3 | FFFFF | 0 |
*FIG. 16B*
▨ Written before power down
☐ Not written before power down
| SEQ. NO. | MIN | MAX |
|---|---|---|
| SEQ. NO. N | LPN 100 | LPN 102 |
| SEQ. NO. N+1 | FFFFF | 0 |
| SEQ. NO. N+2 | FFFFF | 0 |
| SEQ. NO. N+3 | FFFFF | 0 |
*FIG. 16C*

ATOMIC WRITE COMMAND SUPPORT IN A SOLID STATE DRIVE

CROSS REFERENCE TO RELATED APPLICATION(S)

This application claims the benefit of U.S. Provisional Patent Application No. 61/793,513, filed on Mar. 15, 2013, entitled "ATOMIC WRITE COMMAND SUPPORT IN A SOLID STATE DRIVE", the disclosure of which is hereby incorporated by reference.

BACKGROUND

Due to the nature of flash memory in solid state drives (SSDs), data is typically programmed by pages and erased by blocks. A page in an SSD is typically 8-16 kilobytes (KB) in size and a block consists of a large number of pages (e.g., 256 or 512). Thus, a particular physical location in an SSD (e.g., a page) cannot be directly overwritten without overwriting data in pages within the same block, as is possible in a magnetic hard disk drive. As such, address indirection is needed. Conventional data storage device controllers, which manage the Flash memory on the data storage device and interfaces with the host system, use a Logical-to-Physical (L2P) mapping system known as logical block addressing (LBA) that is part of the Flash translation layer (FTL). When new data comes in replacing older data already written, the data storage device controller causes the new data to be written in a new location (as the data storage device cannot directly overwrite the old data) and update the logical mapping to point to the new physical location. At this juncture, the old physical location no longer holds valid data. As such, the old physical location will eventually need to be erased before it can be written again.

Conventionally, a large L2P map table maps logical entries to physical address locations on an SSD. This large L2P map table is usually saved in small sections as writes come in. For example, if random writing occurs, although the system may have to update only one entry, it may nonetheless have to save the entire table or a portion thereof, including entries that have not been updated, which is inherently inefficient.

FIG. 1 shows aspects of a conventional Logical Block Addressing (LBA) scheme for data storage devices. As shown therein, a map table 104 contains one entry for every logical block 102 defined for the data storage device's Flash memory 106. For example, a 64 GB data storage device that supports 512 byte logical blocks may present itself to the host as having 125,000,000 logical blocks. One entry in the map table 104 contains the current location of each of the 125,000 logical blocks in the Flash memory 106. In a conventional data storage device, a Flash page holds an integer number of logical blocks (i.e., a logical block does not span across Flash pages). In this conventional example, an 8 KB Flash page would hold 16 logical blocks (of size 512 bytes). Therefore, each entry in the logical-to-physical map table 104 contains a field 108 identifying the die on which the LBA is stored, a field 110 identifying the flash block on which the LBA is stored, another field 112 identifying the flash page within the flash block and a field 114 identifying the offset within the flash page that identifies where the LBA data begins in the identified Flash page. The large size of the map table 104 prevents the table from being held inside the SSD controller. Conventionally, the large map table 104 is held in an external DRAM connected to the SSD controller. As the map table 104 is stored in volatile DRAM, it must be restored when the SSD powers up, which can take a long time, due to the large size of the table.

When a logical block is written, the corresponding entry in the map table 104 is updated to reflect the new location of the logical block. When a logical block is read, the corresponding entry in the map table 104 is read to determine the location in Flash memory to be read. A read is then performed to the Flash page specified in the corresponding entry in the map table 104. When the read data is available for the Flash page, the data at the offset specified by the Map Entry is transferred from the Flash device to the host. When a logical block is written, the Flash memory holding the "old" version of the data becomes "garbage" (i.e., data that is no longer valid). It is to be noted that when a logical block is written, the Flash memory will initially contain at least two versions of the logical block; namely, the valid, most recently written version (pointed to by the map table 104) and at least one other, older version thereof that is stale and is no longer pointed to by any entry in the map table 104. These "stale" entries are referred to as garbage, which occupies space that must be accounted for, collected, erased and made available for future use. This process is known as "garbage collection".

An atomic command is one in which the command is either performed completely or not at all. Since a power cycle is often the cause of some commands not being able to finish, any atomic write command must take into account the power cycle issue. Conventional methods of implementing atomic write commands in flash-based data storage devices do not allow for efficient detection of incompletely-processed atomic write commands, efficient garbage collection of blocks with in-process atomic writes and meta data or rely on duplicating the atomic write data in buffers, thereby increasing write amplification, system complexity and generating free space accounting issues.

BRIEF DESCRIPTION OF THE DRAWINGS

FIGS. 15A-D illustrate handling of slot number assignment according to one embodiment.

FIGS. 16A-C illustrate handling of partial atomic write commands according to one embodiment.

DETAILED DESCRIPTION

System Overview

Figure 1:
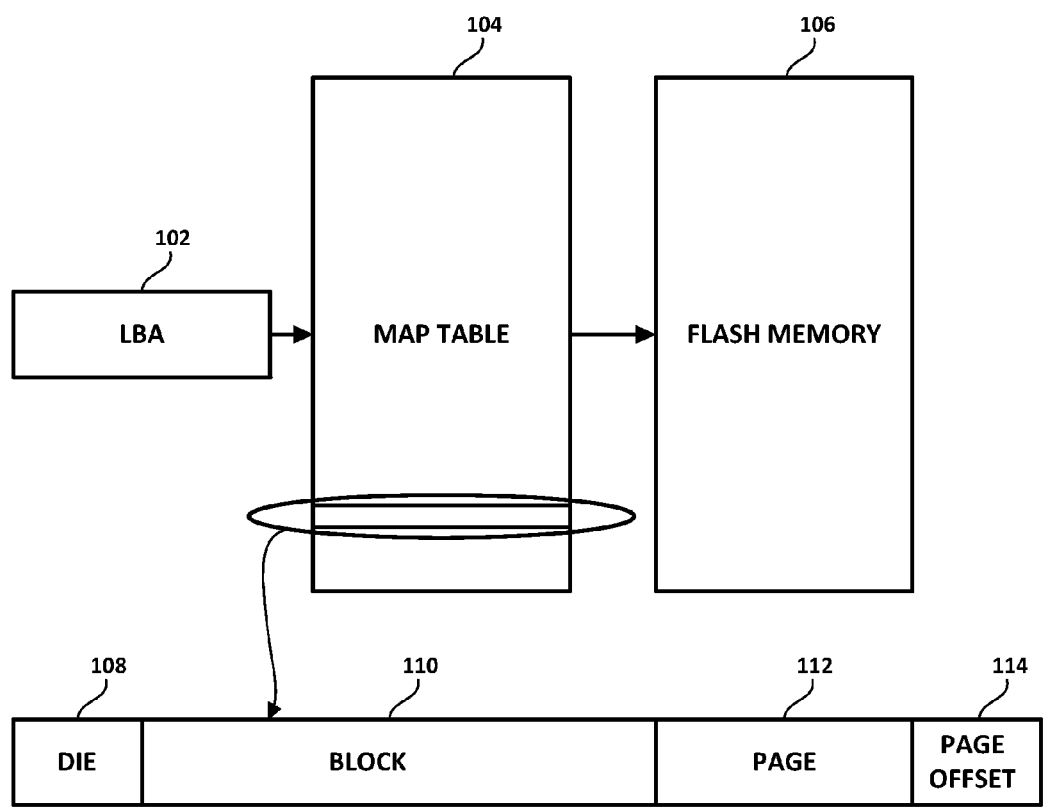
FIG. 1 shows aspects of a conventional Logical Block Addressing scheme for SSDs.
Figure 2:
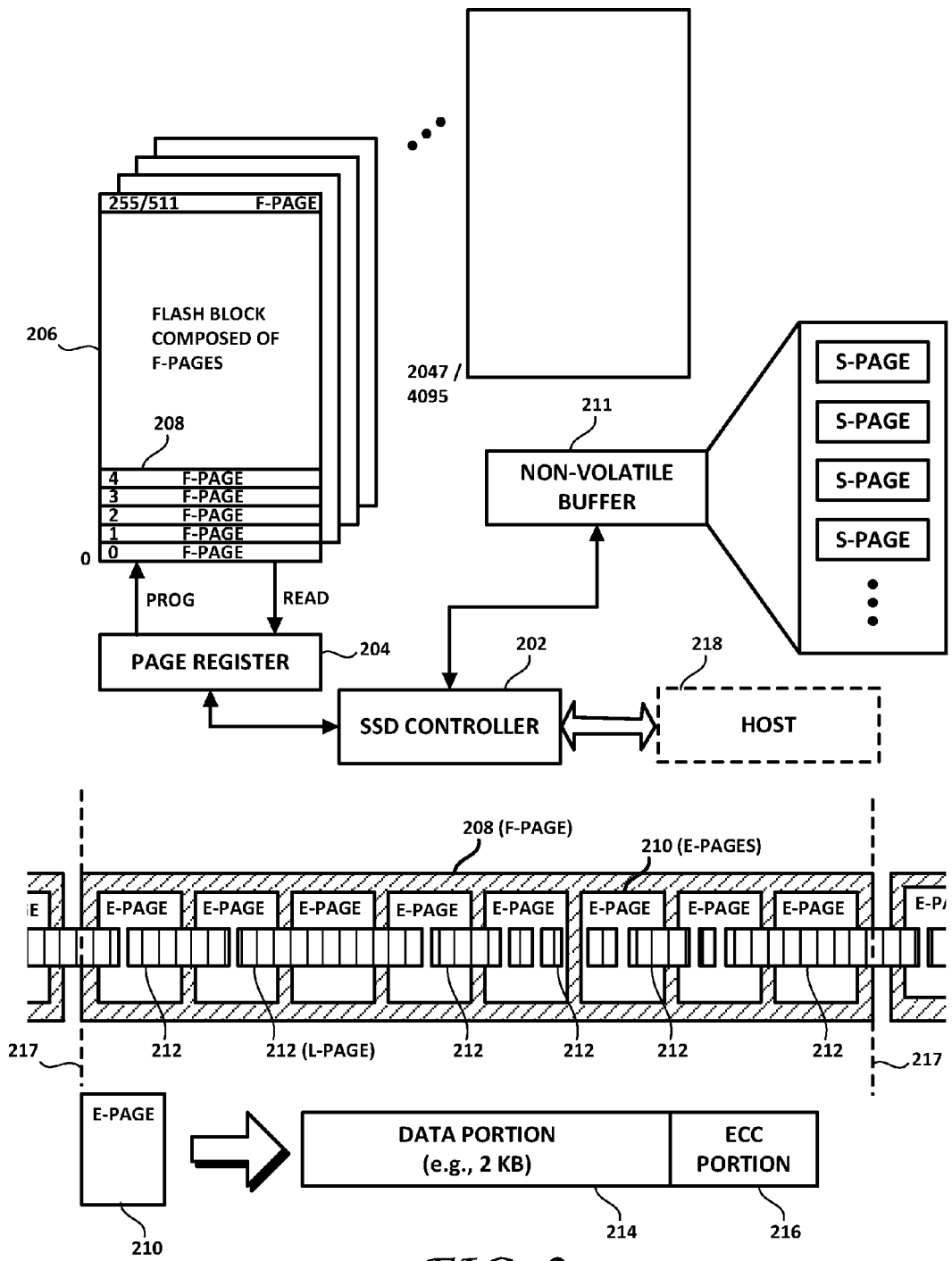
FIG. 2 is a block diagram of a data storage device according to one embodiment, as well as aspects of the physical and logical data organization of such a data storage device.

FIG. 2 is a diagram showing aspects of the physical and logical data organization of a data storage device according to one embodiment. In one embodiment, the data storage device is an SSD. In another embodiment, the data storage device is a hybrid drive including Flash memory and rotating magnetic storage media. The disclosure is applicable to both SSD and hybrid implementations, but for the sake of simplicity the various embodiments are described with reference to SSD-based implementations. A data storage device controller 202 according to one embodiment may be configured to be coupled to a host, as shown at reference numeral 218. The controller may comprise one or more processors that execute some or all of the functions described below as being performed by the controller. The host 218 may utilize a logical block addressing (LBA) scheme. While the LBA size is normally fixed, the host can vary the size of the LBA dynamically. For example, the LBA size may vary by interface and interface mode. Indeed, while 512 bytes is most common, 4 KB is also becoming more common, as are 512+(520, 528, etc.) and 4 KB+(4 KB+8, 4K+16, etc.) formats. As shown therein, the data storage device controller 202 may comprise or be coupled to a page register 204. The page register 204 may be configured to enable the controller 202 to read data from and store data to the data storage device. The controller 202 may be configured to program and read data from an array of flash memory devices responsive to data access commands from the host 218. While the description herein refers to flash memory, it is understood that the array of memory devices may comprise other types of non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

The page register 204 may be configured to enable the controller 202 to read data from and store data to the array. According to one embodiment, the array of flash memory devices may comprise a plurality of non-volatile memory devices in die (e.g., 128 dies), each of which comprises a plurality of blocks, such as shown at 206 in FIG. 2. Other page registers 204 (not shown), may be coupled to blocks on other die. A combination of Flash blocks, grouped together, may be called a Superblock or S-Block. In some embodiments, the individual blocks that form an S-Block may be chosen from one or more dies, planes or other levels of granularity. An S-Block, therefore, may comprise a plurality of Flash blocks, spread across one or more die, that are combined together. In this manner, the S-Block may form a unit on which the Flash Management System (FMS) operates. In some embodiments, the individual blocks that form an S-Block may be chosen according to a different granularity than at the die level, such as the case when the memory devices include dies that are sub-divided into structures such as planes (i.e., blocks may be taken from individual planes). According to one embodiment, allocation, erasure and garbage collection may be carried out at the S-Block level. In other embodiments, the FMS may perform data operations according to other logical groupings such as pages, blocks, planes, dies, etc.

Figure 3:
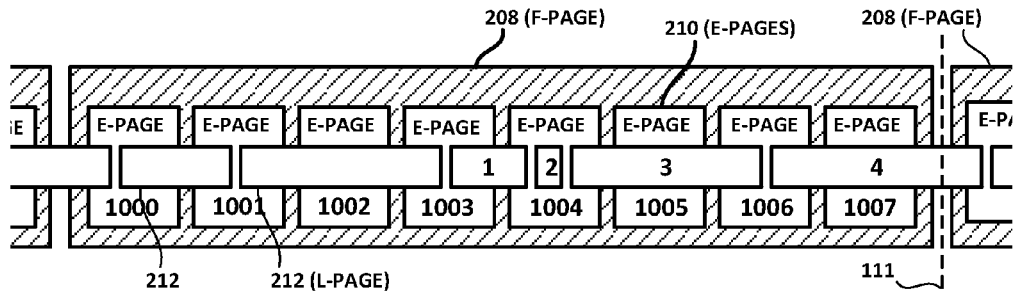
FIG. 3 shows a logical-to-physical address translation map and illustrative entries thereof, according to one embodiment.
Figure 3:
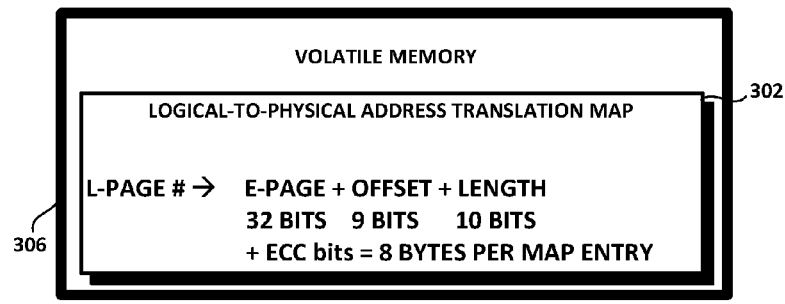

In turn, each of the Flash blocks 206 comprises a plurality of Flash pages (F-Pages) 208. Each F-Page may be of a fixed size such as, for example, 16 KB. The F-Page, according to one embodiment, is the size of the minimum unit of program for a given Flash device. As shown in FIG. 3, each F-Page 208 may be configured to accommodate a plurality of physical pages, hereinafter referred to as E-Pages 210. The term "E-Page" refers to a data structure stored in Flash memory on which an error correcting code (ECC) has been applied. According to one embodiment, the E-Page 210 may form the basis for physical addressing within the data storage device and may constitute the minimum unit of Flash read data transfer. The E-Page 210, therefore, may be (but need not be) of a predetermined fixed size (such as 2 KB, for example) and determine the size of the payload (e.g., host data) of the ECC system. According to one embodiment, each F-Page 208 may be configured to fit a predetermined plurality of E-Pages 210 within its boundaries. For example, given 16 KB size F-Pages 208 and a fixed size of 2 KB per E-Page 210, eight E-Pages 210 fit within a single F-Page 208, as shown in FIG. 3. In any event, according to one embodiment, a power of 2 multiple of E-Pages 210, including ECC, may be configured to fit into an F-Page 208. Each E-Page 210 may comprise a data portion 214 and, depending on where the E-Page 210 is located, may also comprise an ECC portion 216. Neither the data portion 214 nor the ECC portion 216 need be fixed in size. The address of an E-Page uniquely identifies the location of the E-Page within the Flash memory. For example, the E-Page's address may specify the Flash channel, a particular die within the identified Flash channel, a particular block within the die, a particular F-Page and, finally, the E-Page within the identified F-Page.

To bridge between physical addressing on the data storage device and logical block addressing by the host, a logical page (L-Page) construct is introduced. An L-Page, denoted in FIG. 3 at reference numeral 212 may comprise the minimum unit of address translation used by the FMS. Each L-Page, according to one embodiment, may be associated with an L-Page number. The L-Page numbers of L-Pages 212, therefore, may be configured to enable the controller 202 to logically reference host data stored in one or more of the physical pages, such as the E-Pages 210. The L-Page 212 may also be utilized as the basic unit of compression. According to one embodiment, unlike F-Pages 208 and E-Pages 210, L-Pages 212 are not fixed in size and may vary in size, due to variability in the compression of data to be stored. Since the compressibility of data varies, a 4 KB amount of data of one type may be compressed into a 2 KB L-Page while a 4 KB amount of data of a different type may be compressed into a 1 KB L-Page, for example. Due to such compression, therefore, the size of L-Pages may vary within a range defined by a minimum compressed size of, for example, 24 bytes to a maximum uncompressed size of, for example, 4 KB or 4 KB+. Other sizes and ranges may be implemented. As shown in FIG. 3, L-Pages 212 need not be aligned with the boundaries of E-Page 210. Indeed, L-Pages 212 may be configured to have a starting address that is aligned with an F-Page 208 and/or E-Page 210 boundary, but also may be configured to be unaligned with either of the boundaries of an F-Page 208 or E-Page 210. That is, an L-Page starting address may be located at a non-zero offset from either the start or ending addresses of the F-Pages 208 or the start or ending addresses of the E-Pages 210, as shown in FIG. 3. As the L-Pages 212 are not fixed in size and may be smaller than the fixed-size E-Pages 210, more than one L-Page 212 may fit within a single E-Page 210. Similarly, as the L-Pages 212 may be larger in size than the E-Pages 210, L-Pages 212 may span more than one E-Page, and may even cross the boundaries of F-Pages 208, shown in FIG. 3 at numeral 111.

For example, where the LBA size is 512 or 512+ bytes, a maximum of, for example, eight sequential LBAs may be packed into a 4 KB L-Page 212, given that an uncompressed L-Page 212 may be 4 KB to 4 KB+. It is to be noted that, according to one embodiment, the exact logical size of an L-Page 212 is unimportant as, after compression, the physical size may span from few bytes at minimum size to thousands of bytes at full size. For example, for 4 TB SSD device, 30 bits of addressing may be used to address each L-Page 212 that could potentially be present in such a SSD.

To mitigate against lower page corruption errors, one embodiment utilizes a non-volatile buffer to temporarily store updated L-Pages at least until both the lower and upper pages of each MLC are programmed. Additionally details related to the use of such a buffer are provided in commonly-assigned and co-pending U.S. patent application Ser. No. 13/675,913 filed on Nov. 13, 2012, the disclosure of which is hereby incorporated herein in its entirety. Such a non-volatile buffer is shown in FIG. 2 at reference numeral 211. For example, the non-volatile buffer 211 may comprise most any power-safe memory such as, for example, Magnetic Random Access Memory (MRAM), which operates at speeds comparable to DRAM while being storing data in a non-volatile manner. A portion of buffer 211 may be used in supporting atomic write commands, as will be further described starting with FIG. 10.

Address Translation Map and Related Data Structures

FIG. 3 shows a logical-to-physical address translation map and illustrative entries thereof, according to one embodiment. As the host data is referenced by the host in L-Pages 212 and as the data storage device stores the L-Pages 212 in one or more contiguous E-Pages 210, a logical-to-physical address translation map is required to enable the controller 202 to associate an L-Page number of an L-Page 212 to one or more E-Pages 210. Such a logical-to-physical address translation map is shown in FIG. 3 at 302 and, in one embodiment, is a linear array having one entry per L-Page 212. Such a logical-to-physical address translation map 302 may be stored in a volatile memory 306, such as a DRAM or SRAM. FIG. 3 also shows the entries in the logical-to-physical address translation map for four different L-Pages 212, which L-Pages 212 in FIG. 3 are associated with L-Page numbers denoted as L-Page 1, L-Page 2, L-Page 3 and L-Page 4. According to one embodiment, each L-Page stored in the data storage device may be pointed to by a single and unique entry in the logical-to-physical address translation map 302. Accordingly, in the example being developed herewith, four entries are shown. As shown at 302, each entry in the map 302 may comprise an L-Page number, which may comprise an identification of the physical page (e.g., E-Page) containing the start address of the L-Page being referenced, the offset of the start address within the physical page (e.g., E-Page) and the length of the L-Page. In addition, a plurality of ECC bits may provide error correction functionality for the map entry. For example, and as shown in FIG. 3, and assuming an E-Page size of 2 KB, L-follows: E-Page 1003, offset 800, length 1624, followed by a predetermined number of ECC bits (not shown). That is, in physical address terms, the start of L-Page 1 is within (not aligned with) E-Page 1003, and is located at an offset from the starting physical location of the E-Page 1003 that is equal to 800 bytes. Compressed L-Page 1, furthermore, extends 1,624 bytes, thereby crossing an E-Page boundary to E-Page 1004. Therefore, E-Pages 1003 and 1004 each store a portion of the L-Page 212 denoted by L-Page number L-Page 1. Similarly, the compressed L-Page referenced by L-Page number L-Page 2 is stored entirely within E-Page 1004, and begins at an offset therein of 400 bytes and extends only 696 bytes within E-Page 1004. The compressed L-Page associated with L-Page number L-Page 3 starts within E-Page 1004 at an offset of 1,120 bytes (just 24 bytes away from the boundary of L-Page 2) and extends 4,096 bytes past E-Page 1005 and into E-Page 1006. Therefore, the L-Page associated with L-Page number L-Page 3 spans a portion of E-Page 1004, all of E-Page 1005 and a portion of E-Page 1006. Finally, the L-Page associated with L-Page number L-Page 4 begins within E-Page 1006 at an offset of 1,144 bytes, and extends 3,128 bytes to fully span E-Page 1007, crossing an F-Page boundary into E-Page 1008 of the next F-Page.

Collectively, each of these constituent identifier fields (E-Page, offset, length and ECC) making up each entry of the logical-to-physical address translation map 302 may be, for example, 8 bytes in size. That is, for an exemplary 4 TB drive, the address of the E-Page may be 32 bits in size, the offset may be 12 bits (for E-Page data portions up to 4 KB) in size, the length may be 10 bits in size and the ECC field may be provided. Other organizations and bit-widths are possible. Such an 8 byte entry may be created each time an L-Page is written or modified, to enable the controller 202 to keep track of the host data, written in L-Pages, within the Flash storage. This 8-byte entry in the logical-to-physical address translation map may be indexed by an L-Page number or LPN. In other words, according to one embodiment, the L-Page number functions as an index into the logical-to-physical address translation map 302. It is to be noted that, in the case of a 4 KB sector size, the LBA is the same as the LPN. The LPN, therefore, may constitute the address of the entry within the volatile memory. When the controller 202 receives a read command from the host 218, the LPN may be derived from the supplied LBA and used to index into the logical-to-physical address translation map 302 to extract the location of the data to be read in the Flash memory. When the controller 202 receives a write command from the host, the LPN may be constructed from the LBA and the logical-to-physical address translation map 302 may be modified. For example, a new entry therein may be created. Depending upon the size of the volatile memory storing the logical-to-physical address translation map 302, the LPN may be stored in a single entry or broken into, for example, a first entry identifying the E-Page containing the starting address of the L-Page in question (plus ECC bits) and a second entry identifying the offset and length (plus ECC bits). According to one embodiment, therefore, these two entries may together correspond and point to a single L-Page within the Flash memory. In other embodiments, the specific format of the logical-to-physical address translation map entries may be different from the examples shown above.

As the logical-to-physical address translation map 302 may be stored in a volatile memory, it necessarily must be rebuilt upon startup or any other loss of power to the volatile memory. This, therefore, requires some mechanism and information to be stored in a non-volatile memory that will enable the controller 202 to reconstruct the logical-to-physical address translation map 302 before the controller can "know" where the L-Pages are stored in the non-volatile memory devices after startup or after a power-fail event. According to one embodiment, such mechanism and information may be embodied in a construct that may be called a System Journal, or S-Journal. According to one embodiment, the controller 202 may be configured to maintain, in the plurality of non-volatile memory devices (e.g., in one or more of the blocks 206 in one or more die, channel or plane), a plurality of S-Journals defining physical-to-logical address correspondences. According to one embodiment, each S-Journal may cover a pre-determined range of physical pages (e.g., E-Pages). According to one embodiment, each S-Journal may comprise a plurality of journal entries, with each entry being configured to associate one or more physical pages, such as E-Pages, to the L-Page number of each L-Page. According to one embodiment, each time the controller 202 restarts or whenever the logical-to-physical address translation map 302 must be rebuilt, the controller 202 reads the S-Journals and, from the information read from the S-Journal entries, rebuilds the logical-to-physical address translation map 302.

Figure 4:
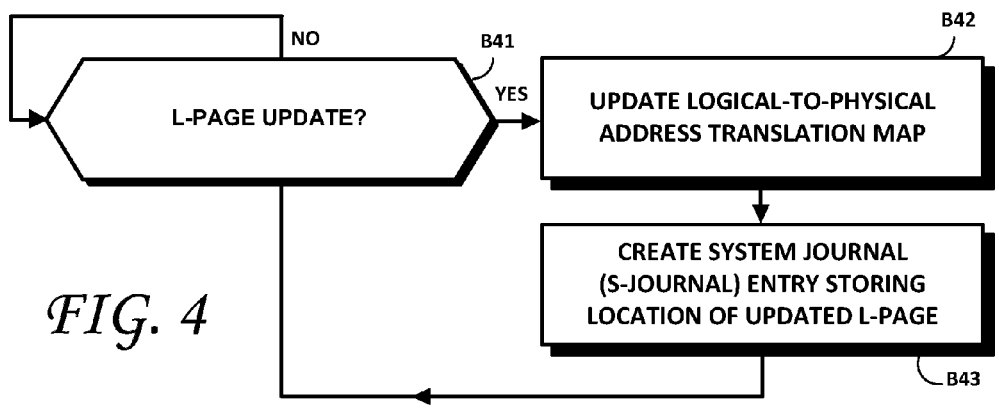
FIG. 4 shows aspects of a method for updating a logical-to-physical address translation map and for creating an S-Journal entry, according to one embodiment.

FIG. 4 shows aspects of a method for updating a logical-to-physical address translation map and for creating an S-Journal entry, according to one embodiment. As shown therein, to ensure that the logical-to-physical address translation map 302 is kept up-to-date, whenever an L-Page is written or otherwise updated as shown at block B41, the logical-to-physical address translation map 302 may be updated as shown at B42. As shown at B43, an S-Journal entry may also be created, storing therein information pointing to the location of the updated L-Page. In this manner, both the logical-to-physical address translation map 302 and the S-Journals are updated when new writes occur (e.g., as the host issues writes to the non-volatile memory devices, as garbage collection/wear leveling occurs, etc.). Write operations to the non-volatile memory devices to maintain a power-safe copy of address translation data may be configured, therefore, to be triggered by newly created S-Journal entries (which may be just a few bytes in size) instead of re-saving all or a portion of the logical-to-physical address translation map, such that Write Amplification (WA) is reduced. The updating of the S-Journals ensure that the controller 202 can access a newly updated L-Page and that the logical-to-physical address translation map 302 may be reconstructed upon restart or other information-erasing power event affecting the non-volatile memory devices in which the logical-to-physical address translation map is stored. Moreover, in addition to their utility in rebuilding the logical-to-physical address translation map 302, the S-Journals are useful in enabling effective Garbage Collection (GC). Indeed, the S-Journals may contain the last-in-time update to all L-Page numbers, and may also contain stale entries, entries that do not point to a valid L-Page.

Figure 5:
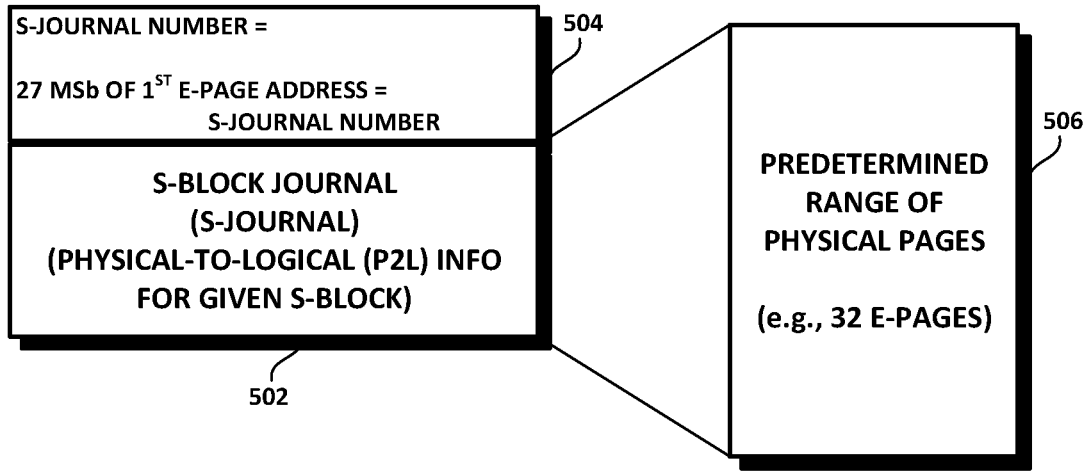
FIG. 5 is a block diagram of an S-Journal, according to one embodiment.

According to one embodiment, the S-Journal may constitute the main flash management data written to the media. According to one embodiment, S-Journals may contain mapping information for a given S-Block and may contain the Physical-to-Logical (P2L) information for a given S-Block. FIG. 5 is a block diagram showing aspects of an S-Journal, according to one embodiment. As shown therein and according to one embodiment, each S-Journal 502 covers a predetermined physical region of the non-volatile memory devices (e.g., Flash) such as, for example, 32 E-Pages as shown at 506, which are addressable using 5 bits. Each S-Journal 502 may be identified by an S-Journal Number 504. The S-Journal Number 504 used for storing P2L information for host data may comprise a portion of the address of the first physical page covered by the S-Journal. For example, the S-Journal Number of S-Journal 502 may comprise, for example, the 27 MSbs of the first E-Page covered by this S-Journal 502.

Figure 6:
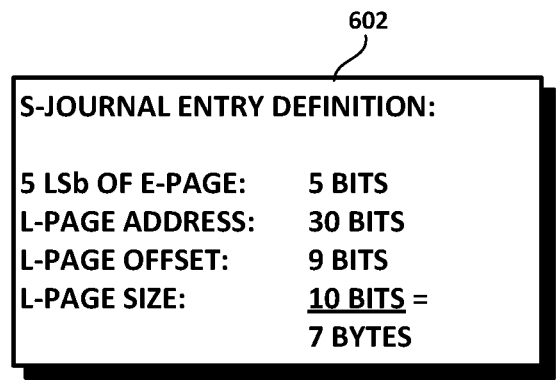
FIG. 6 shows an exemplary organization of one entry of an S-Journal, according to one embodiment.

FIG. 6 shows an exemplary organization of one entry 602 of an S-Journal 502, according to one embodiment. Each entry 602 of the S-Journal 502 may point to the starting address of one L-Page, which is physically addressed in E-Pages. Each entry 602 may comprise, for example, a number (5, for example) of LSbs of the E-Page containing the starting E-Page of the L-Page. The full E-Page address may be obtained by concatenating these 5 LSbs with the 27 MSbs of the S-Journal Number in the header. The entry 602 may then comprise the L-Page number, its offset within the identified E-Page and its size. For example, each entry 602 of S-Journal 502 may comprise the 5 LSbs of the first E-Page covered by this S-Journal entry, 30 bits of L-Page number, 9 bits of E-Page offset and 10 bits of L-Page size, adding up to an overall size of about 7 bytes. Various other internal journal entry formats may be used in other embodiments.

According to one embodiment, due to the variability in the compression or the host configuration of the data stored in L-Pages, a variable number of L-Pages may be stored in a physical area, such as a physical area equal to 32 E-Pages, as shown at 506 in FIG. 5. As a result of the use of compression and the consequent variability in the sizes of L-Pages, S-Journals 502 may comprise a variable number of entries. For example, according to one embodiment, at maximum compression, an L-Page may be 24 bytes in size and an S-Journal 502 may comprise over 2,500 entries, referencing an equal number of L-Pages, one L-Page per S-Journal entry 602.

Figure 7:
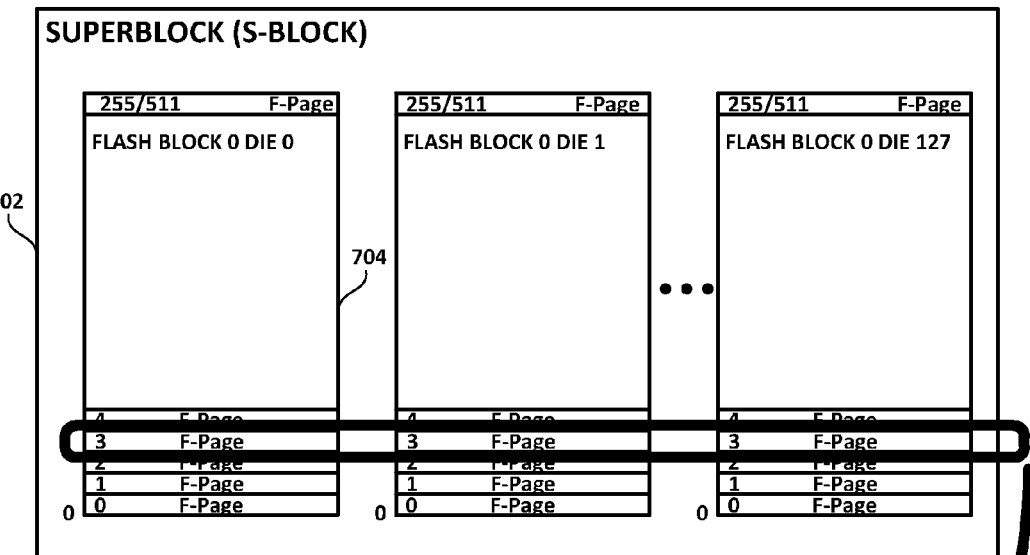
FIG. 7 is a block diagram of a superblock (S-Block), according to one embodiment.
Figure 8:
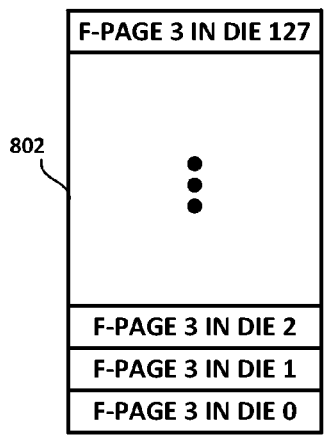
FIG. 8 shows another view of a Super page (S-page), according to one embodiment.

As noted above, S-Journals 502 may be configured to contain mapping information for a given S-Block and may contain the P2L information for a given S-Block. More precisely, according to one embodiment, S-Journals 502 may contain the mapping information for a predetermined range of E-Pages within a given S-Block. FIG. 7 is a block diagram of a superblock (S-Block), according to one embodiment. As shown therein, an S-Block 702 may comprise one Flash block (F-Block) 704 (as also shown at 206 in FIG. 2) per die. An S-Block 702, therefore, may be thought of as a collection of F-Blocks 704, one F-Block per die, that are combined together to form a unit of the Flash Management System. According to one embodiment, allocation, erasure and GC may be managed at the Superblock level. Each F-Block 704, as shown in FIG. 7, may comprise a plurality of Flash pages (F-Page) such as, for example, 256 or 512 F-Pages. An F-Page, according to one embodiment, may be the size of the minimum unit of program for a given non-volatile memory device. FIG. 8 shows a Super Page (S-Page), according to one embodiment. As shown therein, an S-Page 802 may comprise one F-Page per block of an S-Block, meaning that an S-Page 802 spans across an entire S-Block 702.

Figure 9A:
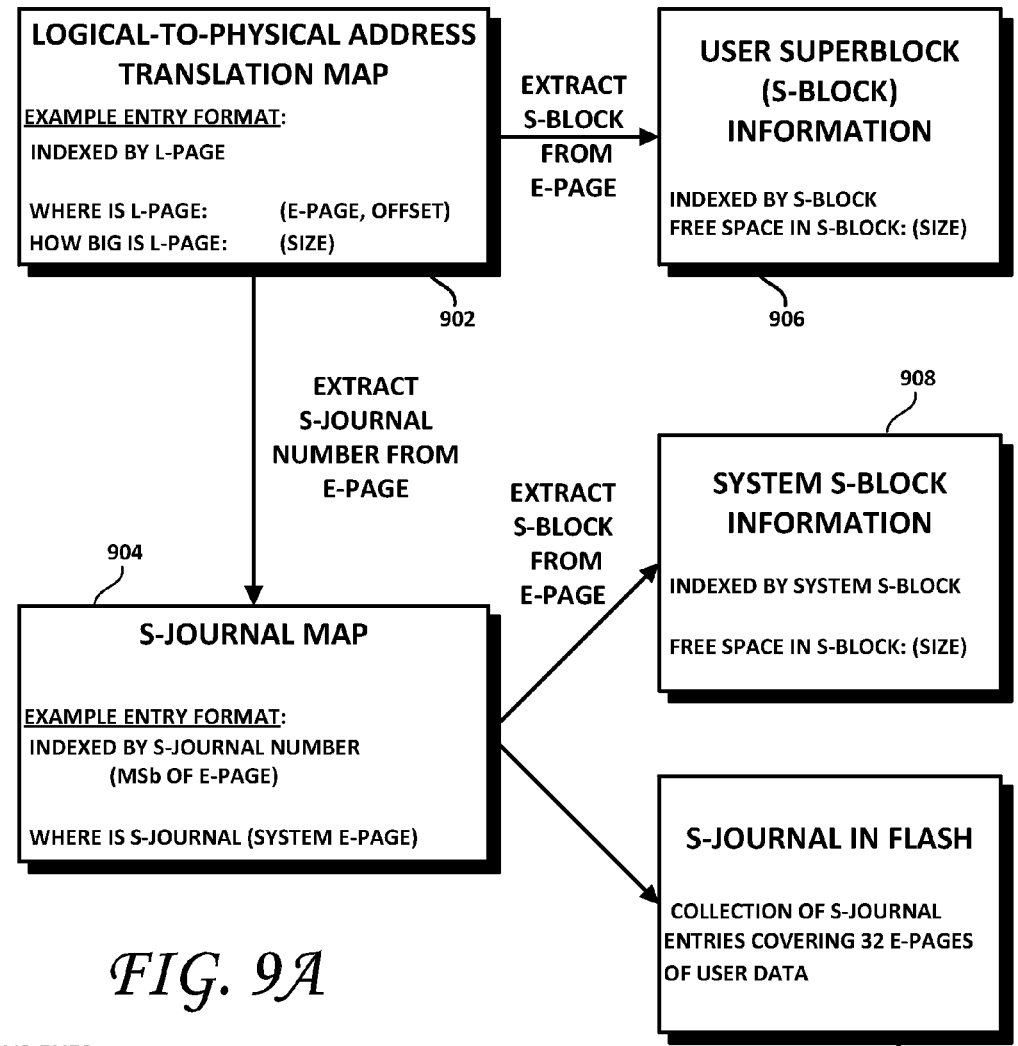
FIG. 9A shows relationships between the logical-to-physical address translation map, S-Journals and S-Blocks, according to one embodiment.

FIG. 9A shows relationships between the logical-to-physical address translation map, S-Journals and S-Blocks, according to one embodiment. Reference 902 denotes the logical-to-physical address translation map. According to one embodiment, the logical-to-physical address translation map 902 may be indexed by L-Page number, in that there may be one entry in the logical-to-physical address translation map 902 per L-Page in the logical-to-physical address translation map. The physical address of the start of the L-Page in the Flash memory and the size thereof may be given in the map entry; namely by E-Page address, offset within the E-Page and the size of the L-Page. As noted earlier, the L-Page, depending upon its size, may span one or more E-Pages and may span F-Pages and blocks as well.

As shown at 904, the volatile memory (e.g., DRAM) may also store an S-Journal map. An entry in the S-Journal map 904 stores information related to where an S-Journal is physically located in the non-volatile memory devices. For example, the 27 MSbs of the E-Page physical address where the start of the L-Page is stored may constitute the S-Journal Number. The S-Journal map 904 in the volatile memory may also include the address of the S-Journal in the non-volatile memory devices, referenced in system E-Pages. From the E-Page referenced in an entry of the S-Journal map 904 in volatile memory, an index to the System S-Block Information 908 may be extracted. The System S-Block Information 908 may be indexed by System S-Block (S-Block in the System Band) and may comprise, among other information regarding the S-Block, the size of any free or used space in the System S-Block. Also from the S-Journal map 904, the physical location of the S-Journals 910 in the non-volatile memory devices may be extracted.

The System Band, according to one embodiment, does not contain L-Page data and may contain all File Management System (FMS) meta-data and information. The System Band may be configured as lower-page only for reliability and power fail simplification. During normal operation, the System Band need not be read except during Garbage Collection. According to one embodiment, the System Band may be provided with significantly higher overprovisioning than the data band for overall WA optimization. Other bands may include the Hot Band, which may contain L-Page data and is frequently updated, and the Cold Band, which is a physical area of memory storing static data retained from the garbage collection process, which may be infrequently updated. According to one embodiment, the System, Hot and Cold Bands may be allocated by controller firmware on an S-Block basis.

As noted above, each of these S-Journals in the non-volatile memory devices may comprise a collection of S-Journal entries and cover, for example, 32 E-Pages worth of data. These S-Journals 910 in the non-volatile memory devices enable the controller 202 to access the S-Journals entries in the non-volatile memory devices upon startup, enable the controller 202 to rebuild in volatile memory not only the logical-to-physical address translation map 902, but also the S-Journal map 904, the User S-Block Information 906, and the System S-Block Information 908.

The S-Journals in the non-volatile memory devices may also contain all of the stale L-Page information, which may be ignored during garbage collection after the logical-to-physical address translation map 902 and the S-Journal Map 904 in volatile memory are rebuilt. The S-Journals, therefore, may be said to contain a sequential history of all currently valid updates as well as some stale updates to the logical-to-physical address translation map 902.

Figure 9B:
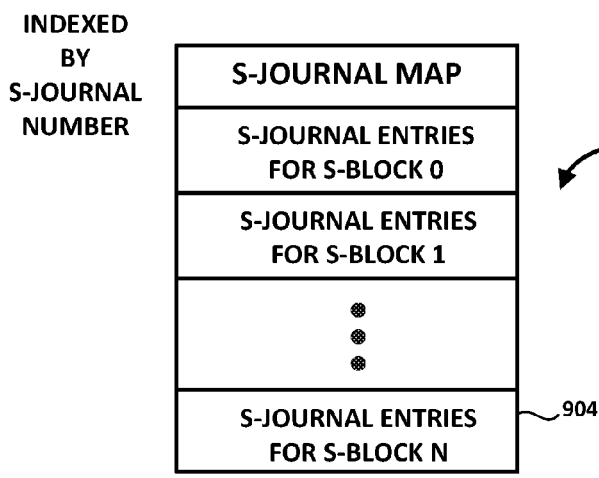
FIG. 9B is a block diagram of an S-Journal Map, according to one embodiment.

FIG. 9B is a block diagram of another view of an S-Journal Map 904, according to one embodiment. The S-Journal Map 904 may reference a plurality of S-Journal entries for each S-Block. According to one embodiment, the S-Block Number may be the MSb of the S-Journal Number. The size of the S-Journal map 904 may be correlated to the number of S-Blocks times the number of S-Journal entries per S-Block. Indexing into the S-Journal Map 904, therefore, may be carried out by referencing the S-Block Number (the MSb of the S-Journal Number) and the S-Journal entry for that S-Block number. The controller 202 may be further configured to build or rebuild a map of the S-Journals and store the resulting S-Journal Map 904 in volatile memory. For example, upon restart or upon the occurrence of another event in which power fails or after a restart subsequent to error recovery, the controller 202 may read the plurality of S-Journals in a predetermined sequential order, build a map of the S-Journals stored in the non-volatile memory devices based upon the sequentially read plurality of S-Journals, and store the built S-Journal Map 904 in the volatile memory. In particular, the rebuilt S-Journal Map 904 may be configured to contain the physical location for the most recently-written version of each S-Journal. Indeed, according to one embodiment, in rebuilding the S-Journal Map 904, the physical location of older S-Journals may be overwritten when a newer S-Journal is found. Stated differently, according to one embodiment, the S-Journal Map 904 may be rebuilt by the controller 202 based upon read S-Journals that are determined to be valid.

Atomic Write Commands

In one embodiment, to maintain the coherency of the logical-to-physical address translation map and to provide a mechanism for recovering from unsuccessful (incomplete) atomic write commands, the original entry or entries in the logical-to-physical address translation map should preferably be maintained until such time as the atomic write command is determined to have been successfully completed. Such a mechanism should enable a determination of an unsuccessful atomic write command, even in the presence of an intervening power fail event and must safeguard access to the original data stored in the non-volatile memory devices. According to one embodiment, atomic sequence numbers may be used for this purpose.

Figure 10:
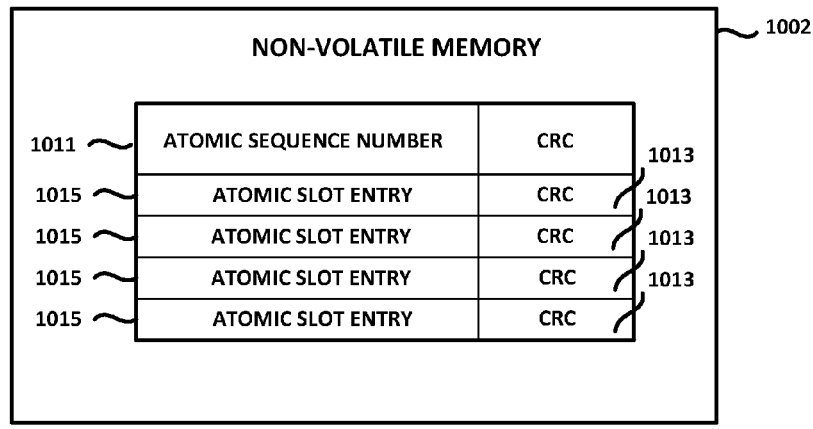
FIG. 10 is a block diagram of a data structure in which atomic sequence numbers, used in processing atomic write commands, may be stored, according to one embodiment.

FIG. 10 is a block diagram of an atomic sequence number table data structure 1002 that may be stored in, for example, in power-safe memory in which atomic sequence numbers 1011, used in processing atomic write commands, may be stored, according to one embodiment. According to one embodiment, the power safe memory may comprise volatile memory with a battery back-up, a volatile memory that is safely stored to the non-volatile memory devices upon power-down and safely restored to the volatile memory upon power-up, or MRAM, for example. As shown in FIG. 10, the unique atomic sequence numbers 1011 each may be stored in an atomic slot 1015. According to one embodiment, each atomic slot 1015 may be associated with, for error recovery purposes, a value of a CRC 1013 applied to its atomic sequence number. For example, a 16-bit CRC 1013 may be generated to ensure proper recovery of the atomic sequence number in case of corruption thereof. Each L-Page of an atomic write command may, according to one embodiment, be associated with one of the atomic slots 1015, each of which may be configured to store the atomic sequence number corresponding to the atomic write command. Such slots 1015 may be freed once it is determined that the atomic write command has successfully completed. The freed slots may then be added to a free slot list and re-used during subsequent atomic write commands.

In one embodiment, the atomic sequence numbers may be unique with respect to individual slots, or a sub-group of slots. For example, all the atomic sequence numbers may be unique to slot 0, but non-unique with respect to the atomic sequence numbers used for slot 1. A bit or a flag value may be used to indicate different groupings within which uniqueness is guaranteed.

In addition, in one embodiment, the slots may be used in such a way as to prevent the same slot from being used for consecutive sequence numbers. The scheme prevents a scenario in which several consecutive sequence numbers may be used in the same slot. Under such a case, if power loss occurs and writing of the sequence number to a slot becomes corrupted, then upon power-up it cannot be determined what the maximum sequence no. was in use before the power loss. If the maximum sequence no. cannot be determined, then the uniqueness of the sequence numbers assigned cannot be guaranteed.

An example scheme of ensuring that consecutive sequence numbers are not used in the same slot is shown in FIGS. 15A-D. In FIG. 15A, five of the six slots are in use and the next sequence no. 10006 is assigned to the free slot no. 4, which is shown in FIG. 15B. In FIG. 15C, slot no. 4 is blocked from being assigned to the next sequence number, which is 10007, since it was just assigned to the prior sequence no. 10006. This is the case even if the atomic command associated with sequence no. 10006 completes before the other commands and slot no. 4 becomes the first free slot. However, sequence no. 10007 can use any other slots. So in FIG. 15D, sequence no. 10007 is assigned to slot no. 5 when it becomes available. Now slot no. 5 becomes off-limit to sequence no. 10008, and so on. This scheme ensures that the maximum sequence no. already used can be determined with certainty. If FIG. 15D reflects the condition of the slots encountered at power-up, the next sequence number to be used may be the maximum one encountered (which is 10007 in this case), plus some offset (e.g., two, so that 10007+2=10009). This ensures that the next sequence number assigned is unique and hasn't been used before the power cycle.

The atomic sequence numbers, according to one embodiment, may be used to filter out partial (e.g., in-process or interrupted) atomic writes during reconstruction of the logical-to-physical address translation map after a shutdown or other power-fail event. In one embodiment, the filtering is enabled by associating persistent mapping information (e.g., S-Journal entries) of atomic write commands with an atomic sequence number that is present in the power-safe memory until the command is completed. In one embodiment, that associated atomic number is changed as a commit step to signify the completion of the atomic write command, and upon reconstruction of the mapping table, the absence of a matching sequence number in the power-safe memory signifies that the associated persistent mapping information relates to a completed atomic write command.

To ensure that the atomic sequence number for an atomic write number is not affected by such power-fail event, it may be, according to one embodiment, stored in a power-safe memory that may be consulted during reconstruction of the logical-to-physical address translation map. According to one embodiment, the power-safe memory may comprise an MRAM or, for example, a battery-backed RAM or some other form of non-volatile RAM. The atomic sequence number stored therein may be relied on as a reliable indicator of whether an atomic write command successfully completed or not. To do so, the atomic sequence number may be configured to be unique. According to one embodiment, the atomic sequence number may be configured to be non-repeating over a projected lifetime of the data storage device. For example, the unique sequence number may comprise a large sequence of bits, each combination of which is used only once. For example, the large sequence of bits may be initialized to all 1's or all 0's and either decremented or incremented upon each occurrence of an atomic write. For example, for a representative 2 TB drive and 4 KB L-Pages (maximum uncompressed size, according to one embodiment, of an L-Page), a sequence number of 48 bits would be more than sufficient to provide 512K unique sequence numbers every second for a period of 5 years.

According to one embodiment, the physical-to-logical mapping shown and described herein may be modified to accommodate atomic write commands. Indeed, as described above, data may be stored in a plurality of L-Pages, each which being associated with a logical address. The logical-to-physical address translation map, maintained in the volatile memory, continues to enable determination of the physical location, within one or more of the physical pages, of the data referenced by each logical address. It is recalled that, for a non-atomic command, data specified by such non-atomic write command is stored in one or more L-Pages and that the logical-to-physical address translation map is updated after each L-Page of non-atomic data is written.

Keeping the foregoing in mind, according to one embodiment, such a process may be modified for atomic write commands. Indeed, upon receipt of an atomic write command, the data specified by the atomic write command may be stored in one or more L-Pages, as is the case for non-atomic writes. For atomic writes, however, the logical-to-physical address translation map is not, according to one embodiment, updated after each L-Page of atomic write data. Instead, the update to the logical-to-physical address translation map may be deferred until all L-Pages storing data specified by the atomic write command have been written in a power-safe manner.

Prior to updating the logical-to-physical address translation map, mapping information related to the atomic write command may be written in volatile memory. According to one embodiment, such mapping information may comprise an indication of the physical location, in the non-volatile memory devices, of each L-Page storing the data specified by the atomic write command. Specifically, according to one embodiment, the mapping information for the L-Pages storing the data specified by the atomic write command may comprise the equivalent of a logical-to-physical address translation map entry. Such entry, according to one embodiment, may be stored separately from other entries in the logical-to-physical address translation map 302 in volatile memory, as the logical-to-physical address translation map may not be updated until all data specified by the atomic write command has been written in a power-safe manner.

Figure 11:
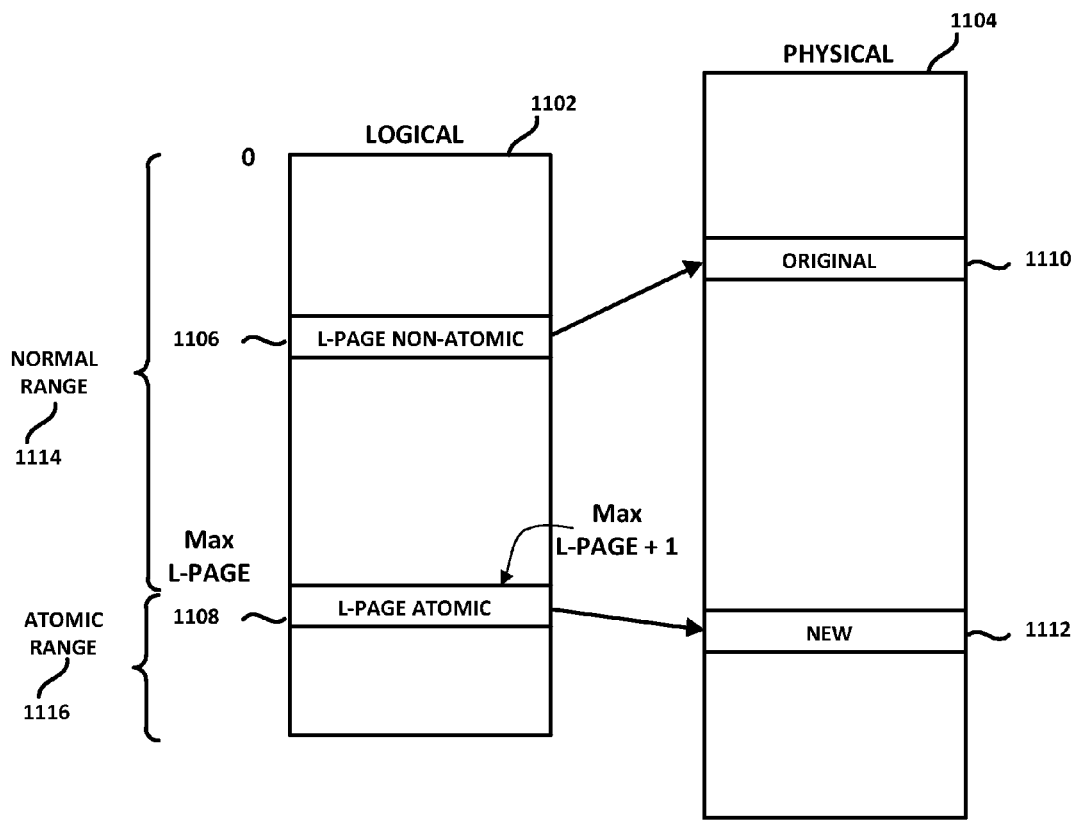
FIG. 11 is a block diagram illustrating aspects of non-atomic and atomic writes, according to one embodiment.

FIG. 11 shows the manner, according to one embodiment, in which this indication of the physical location of L-Pages storing data specified by the atomic write command may be stored in the volatile memory. FIG. 11 shows an entry 1106 in a logical-to-physical address translation map and the location 1110 in the non-volatile memory devices where E-Page(s) storing such L-Page are stored, for a non-atomic write, according to one embodiment. FIG. 11 also shows the indication 1108 of the physical location 1112 of L-Page(s) storing data specified by the atomic write command, according to one embodiment. Note that although the data specified by the atomic write command is written to the non-volatile memory devices in the manner described above, the logical-to-physical mapping may be carried out differently.

The entry 1106 in the logical-to-physical address translation map (corresponding to mapping information for a non-atomic write command) may conform, for example, to the format specified in FIG. 3, and may comprise an 8 byte LPN. The indication 1108 of the physical location 1112 of the L-Page(s) storing the data specified by the atomic write command (the mapping information corresponding to an atomic write command), on the other hand is not, according to one embodiment, an entry in the logical-to-physical address translation map. Although this indication 1108 may have the same format (E-Page+Offset+Length, for example) as the logical-to-physical address translation map entries shown in FIG. 3, such indication 1108 may not, according to one embodiment, be stored in the logical-to-physical address translation map. Indeed, according to one embodiment, such indication 1108 may be stored separately from the logical-to-physical address translation map.

As shown in FIG. 11, the logical-to-physical address translation map may be configured to store mapping entries spanning at least a portion of a logical capacity of the data storage device (e.g., 2 TB or some fraction thereof for a 2 TB drive data storage device). This is referred to, in FIG. 11, as the normal range 1114. The normal range 1114, therefore, may be configured to contain mapping entries of the logical-to-physical address translation map that map LBAs to physical locations within the non-volatile memory devices from a $0^{th}$ L-Page to a Max L-Page; that is, up to the maximum storage capacity of the data storage device. The atomic range 1116 may begin, according to one embodiment, beyond the normal range at, according to one embodiment, Max L-Page+1. Therefore, writing the indication 1108 of the physical location 1112 of L-Page(s) storing data specified by the atomic write command to the atomic range 1116 does not constitute an update to the logical-to-physical address translation map. It is to be understood, therefore, that this indication 1108 of the physical location 1112 of L-Page(s) storing data specified by the atomic write command may be written to any other portion of a volatile memory, whether the same volatile memory storing the logical-to-physical address translation map or not. Therefore, the indication 1108 of the physical location 1112 of L-Page(s) storing data specified by the atomic write command may be stored, for example, in an area of the volatile memory 1102 other than that portion thereof storing the logical-to-physical address translation map, or to another volatile memory altogether. The indication 1108 of the physical location 1112 of L-Page(s) storing data specified by the atomic write command may, in the same manner as an entry in the logical-to-physical address translation map, point to the physical location 1112, in the non-volatile memory devices 1104, where such L-Pages are stored.

According to one embodiment, after all L-Pages storing the data specified by the atomic write command are written, the logical-to-physical address translation map may be updated with the indication of the physical location 1112 of L-Page(s) storing data specified by the atomic write command. That is, according to one embodiment, it is only when the L-Page(s) storing data specified by the atomic write command have been written in a power safe manner that the logical-to-physical address translation map may be updated with the indication 1108 of the physical location 1112 of L-Page(s) storing data specified by the atomic write command. For example, the corresponding entry 1108 in the atomic range 1116 may be copied to the normal range 1114, which updates the logical-to-physical address translation map. Note that the physical location 1112 in the non-volatile memory devices 1104 corresponding to the L-Page(s) storing data specified by the atomic write command does not change, as only the location of the indication 1108 (i.e., the mapping information) changes—not the physical location of the data pointed thereto in the non-volatile memory devices.

According to one embodiment, after the logical-to-physical address translation map has been updated, the atomic write command may be considered to be effectively complete. At that time, the successful completion of the atomic write command may be acknowledged to the host, as all of the data specified thereby has been stored in a power safe manner and as the logical-to-physical address translation map has been successfully updated, thereby maintaining the coherency of the logical-to-physical address translation map, even in the event of a power cycle.

As noted above, according to one embodiment, it is only when all of the L-Page(s) storing data specified by the atomic write command have been written in a power safe manner that the logical-to-physical address translation map may be updated with the indication 1108 of the physical location 1112 of L-Page(s) storing data specified by the atomic write command. According to one embodiment, to determine whether all L-Pages storing data specified by the atomic write command have been stored in a power-safe manner, one embodiment comprises modifying S-Journal entries for atomic write commands. Recall that S-Journals define physical-to-logical address correspondences, with each S-Journal comprising a plurality of entries that are configured to associate one or more physical pages to each L-Page. According to one embodiment, S-Journal entries for L-Pages storing data specified by an atomic write command are configured to form part of a mechanism to enable a determination of whether the atomic write command was completed or not completed, upon reconstruction of the logical-to-physical address translation map. Such reconstruction of the logical-to-physical address translation map may have been necessitated, for example, upon occurrence of a power fail event, which event necessitates reconstructing the logical-to-physical address translation map. Indeed, if the power fail event occurred while the controller 202 was processing an atomic write command, all of the L-Pages storing data specified by the atomic write command may or may not have been stored in a power-safe manner. Moreover, in the event of a power cycle, the indication 1108 of the physical location 1112 of L-Page(s) storing data specified by the atomic write command is no longer available; as such indication was stored in volatile memory. The corresponding S-Journal entries, modified for the atomic write command may, according to one embodiment, provide part of a persistent mechanism for determining whether the atomic write successfully completed or not prior to the power fail event.

According to one embodiment, by reference to the S-Journal entry or entries for the L-Page(s) storing data specified by the atomic write command and the unique sequence number stored in the power-safe memory for that atomic write command, the controller 202 may determine whether the atomic write command was successfully completed. According to one embodiment, if the atomic write command is determined to not have completed successfully, the corresponding S-Journal entry or entries are not used during reconstruction of the logical-to-physical address translation map, thereby maintaining its coherency and ensuring that the all-or-nothing aspect of atomic writes is respected. If, however, reference to the S-Journal entry or entries for the L-Page(s) storing data specified by the atomic write command and the atomic sequence number stored in the power-safe memory for that atomic write command indicates that the atomic write command did, in fact, complete successfully, the corresponding S-Journal entry or entries may be safely used to reconstruct the logical-to-physical address translation map.

Figure 12:
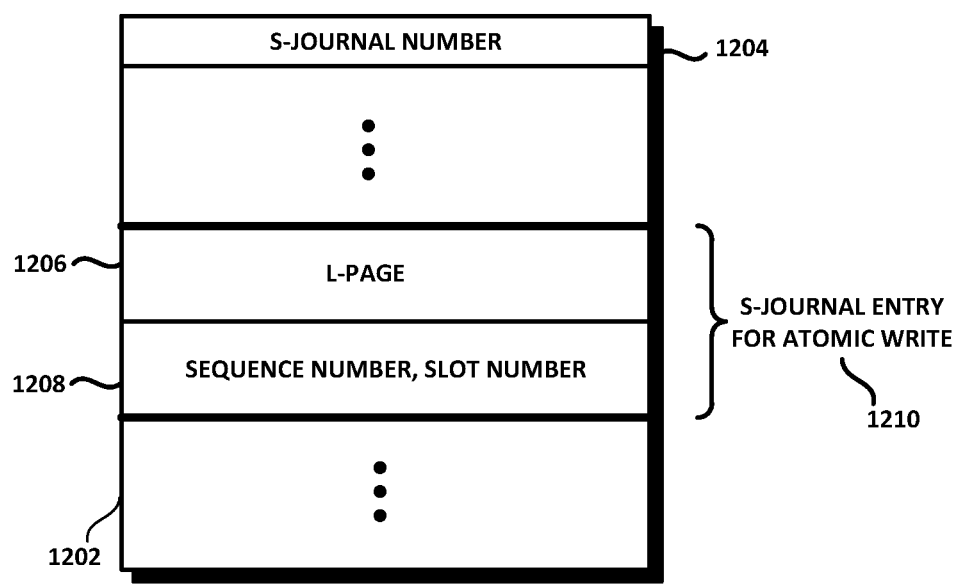
FIG. 12 shows aspects of an S-Journal comprising an S-Journal entry for an atomic write, according to one embodiment.

According to one embodiment, each entry 1210 of an S-Journal 1202 for an atomic write command may comprise, in addition to the indication of the location, within the non-volatile memory devices, of one L-Page storing date specified by the atomic write command (shown in FIG. 12 as L-Page 1206), a unique sequence number, such as shown at 1208 in FIG. 12. As also shown at 1208 in FIG. 12, in addition to the atomic sequence number, each entry 1210 of an S-Journal 1202 for an atomic write command may also comprise, according to one embodiment, a slot number. According to one embodiment, this slot number may correspond to one of a plurality of slots defined in the power-safe memory (e.g., MRAM, battery-backed RAM or NVRAM). Such power-safe memory is shown in FIG. 2 at 211. The indication of the location, within the non-volatile memory devices, of one L-Page storing data specified by the atomic write command (L-Page 1206) may comprise, according to one embodiment, an atomic header specifically identifying that entry as having been made during an atomic write command. For example, such header may comprise, in addition to the normal header of a non-atomic write entry (for example, the 5 LSbs of the E-Page containing the starting E-Page of the L-Page concatenated with the 27 MSbs of the S-Journal Number 1204), the atomic slot number and the atomic sequence number for that slot. Other organizations are possible.

According to one embodiment, for each atomic write command, one of the non-repeating atomic sequence numbers may be generated and saved in one of the plurality of slots in the power-safe temporary storage. According to one embodiment, for each atomic write command, each slot defined within the power-safe temporary storage may store the same unique sequence number. That same unique sequence number is also saved within each entry or entries 1210 of the S-Journal or S-Journals comprising entries for the L-Page or L-Pages storing data specified by the atomic write command. According to one embodiment, it is only when the atomic write command has completed that the unique sequence number stored in a slot defined in the power-safe temporary storage is changed, indicating a commit of the atomic write command. According to one embodiment, the changing of the unique sequence number associated with the atomic write command, indicative of a completed atomic write command, is carried out before acknowledging the completion of the atomic write command to a host 218.

This changed atomic sequence number, at this point in time, corresponds to and may be used by a next-occurring atomic write command. The changing of the unique sequence number associated with the atomic write command may comprise, for example, incrementing or decrementing the current sequence number. The changing of the atomic sequence number in the power-safe temporary storage, therefore, may serve as the remaining portion of the mechanism for determining whether a given atomic write command has successfully completed. Indeed, according to one embodiment, the controller 202 may determine whether the atomic write command has completed during reconstruction of the translation map (and thus whether to update the logical to physical translation map with the S-Journal entry for the L-Pages specified by the atomic write) by comparing the unique sequence number stored in the S-Journal entry or entries for that atomic write command with the unique sequence number stored in the power-safe temporary storage.

As the unique sequence number is only changed upon successfully completing the atomic write command, finding an identical unique sequence number in the S-Journal entry corresponding to an L-Page specified by an atomic write command and in the power-safe temporary storage is indicative of the corresponding atomic write command not having completed successfully. That is, a match between the unique sequence number stored in the S-Journal entry or entries for the atomic write command and the unique sequence number stored in the power-safe temporary storage indicates an incomplete atomic write command. Such a match also means that the atomic write command was not acknowledged to the host and that the L-Page information in the S-Journal(s) containing entries for the L-Page(s) specified by the atomic write command should not be used to reconstruct the logical-to-physical address translation map. Other than as modified herein, the reconstruction of the logical-to-physical address translation map may be carried out according to the methods shown and described in commonly-assigned and co-pending U.S. patent application Ser. No. 13/786,352 filed on Mar. 5, 2013, the disclosure of which is hereby incorporated herein in its entirety.

In one embodiment, upon accessing the atomic sequence number in the power-safe temporary storage, a check may be carried out, to ensure the validity of the CRC associated with the atomic sequence number. According to one embodiment, when the unique sequence number stored in the S-Journal entry or entries for the atomic write command is not the same as the atomic sequence number stored in the power-safe temporary, the S-Journal entry or entries are used to update the logical-to-physical address translation map. However, according to one embodiment, when a match occurs between the unique sequence number stored in the S-Journal entry or entries for the atomic write command and the unique sequence number stored in the power-safe temporary storage during reconstruction, the S-Journal entry or entries are not used to update the logical-to-physical address translation map and the atomic write command will appear as if it never was executed.

Handling Partial Atomic Write Commands

In one embodiment, there is an additional process to address the relics of a partial atomic write scenario. In one embodiment, the controller tracks additional information concerning the L-Page range affected by a partially completed atomic write command. As an example, when a match occurs in the sequence number during reconstruction indicating a partial atomic write command, a tracking table is consulted to determine the extent of data written by the partial atomic write command.

An example tracking table used in one embodiment, shown as three versions corresponding to three time periods, is shown in FIGS. 16A-C. The three figures show how the tracking table tracks a partially completed atomic write command. In the example shown, a partially completed atomic command was intended to write to LPN (L-Page Number) 100 through LPN 103, but had only written to LPN 100 and LPN 102 (denoted by shaded boxes). The command was interrupted before LPN 101 and LPN 103 could be written. FIG. 16A shows the tracking table initialized with default values at start-up, before the attempted execution of the command in question. In one embodiment, the MIN and MAX address fields are seeded with default address values of a maximum value such as FFFFF and a minimum value such as 0, respectively.

In FIG. 16B, the tracking table has recorded the fact that the atomic command with Seq. No. N has written to LPN 100. An LPN written by an atomic write command with a matched atomic write sequence no. is compared to both the MIN and the MAX field address values as follows. If the written LPN is less than the current MIN value, the written LPN becomes the current MIN value. In the example of FIG. 16A and FIG. 16B, since LPN 100 is less than FFFFF, LPN 100 replaces FFFFF as the MIN value. Conversely, in the MAX field, if the written LPN is greater than the current MAX value, the written LPN becomes the current MAX value. Thus in the example LPN 100 also replaces 0 in the MAX field. FIG. 16C shows the state of the table after LPN 102 is written. The MIN field remains unchanged since LPN 102 is greater than LPN 100, but the MAX field is updated to LPN 102. Since each LPN of a command can be written out of order, the tracking table enables tracking of the range of L-Pages affected by an atomic write command and enables recovery if the command does not complete. Over the course of execution, the MIN and MAX fields are filled and correlated with various atomic sequence numbers as shown in the figures.

In one embodiment, the tracking enables a clean-up process during reconstruction. In one embodiment, as one of the final steps of reconstruction, for each partially completed atomic command detected, a copy command is issued to copy the original data spanning from the MIN address to the MAX address indicated in the tracking table, so that the original data is re-written, thereby generating new S-Journal entries. This has the effect of eliminating the partial atomic write for future power cycles. Continuing with the present example in FIGS. 16A-C, upon detecting that the command with the Seq. No. N did not complete, the clean-up procedure will re-write LPN 100 through 102 so that the original version of L-Pages at LPN 100 and 102 are re-written in the non-volatile memory and new S-Journal entries are generated to account for the new writes. Future reconstruction will correctly account for the fact that the atomic write didn't complete, as the latest S-Journal entries will indicate that the data in the affected address range have been reverted back to the original state before the failed atomic write.

According to one embodiment, the data storage device may reports that it is ready to process host commands shortly after having completed the reconstruction of the logical-to-physical address translation map (and optionally other housekeeping activities such as populating the S-Journal map 904 and other tables in volatile memory). In such an embodiment, the data storage device is configured to carry out free space accounting operations (including, e.g., rebuilding one or more free space table(s)) while and/or after processing host (i.e., data access) commands. Such incoming host commands may alter the free space accounting of the S-Blocks. Such changes in the amount of valid data that is present in each S-Block may be accounted for, according to one embodiment. With respect to atomic write commands, according to one embodiment, free space accounting, as described above, may be deferred until after all L-Pages storing data specified by the atomic write command have been stored in the non-volatile memory devices and the atomic write command is determined to have completed.

Garbage Collection

According to one embodiment, atomic sequence numbers affect the manner in which garbage collection may be carried out, both on the user band (where user data may be stored) and the system band (which contains File Management System meta-data and information). When an S-Journal is parsed during garbage collection of the user band, and an atomic write entry (identified by its header, for example) is encountered, the atomic sequence number in the specified slot may be checked against the atomic sequence number stored in the power-safe temporary storage (e.g., the MRAM, battery backed RAM, or other form of non-volatile RAM).

For example, the atomic sequence number may be stored in the non-volatile buffer 211. If the two do not match, the atomic write command completed successfully and the L-Page(s) storing the data specified by the atomic write command may be copied and moved to another S-Block or S-Blocks. The header of the L-Page(s) may be stripped of its atomic write attributes when generating the new S-Journal entry for the copied and moved data. If, however, the atomic sequence number in the specified slot matches (an unlikely event, as that S-Block would presumably not have been picked for garbage collection) the atomic sequence number stored in the power-safe temporary storage, indicating an in-process atomic write command, then the corresponding L-Page may be copied, kept atomic and an update may be carried out to the mapping information (such as 1108 in FIG. 11, for example) comprising an indication of the physical location of the L-Page storing the data specified by the atomic write command.

When an S-Journal is parsed during garbage collection of the system band, and an atomic write entry (identified by its header, for example) is encountered, the atomic sequence number in the specified slot may be checked against the atomic sequence number stored in the power-safe temporary storage (e.g., the MRAM). If the two do not match, the atomic write command completed successfully and the L-Page(s) storing the data specified by the atomic write command may be copied and moved to another S-Block or S-Blocks. In that case, header of the L-Page may be stripped of its atomic write attributes. If, however, the atomic sequence number in the specified slot matches the atomic sequence number stored in the power-safe temporary storage, indicating an in-process atomic write command, then the corresponding L-Page may be copied and moved to another S-Block or S-Blocks, keeping the header indicative of an atomic write and the mapping information (such as 1108 in FIG. 11, for example) comprising an indication of the physical location of the L-Page storing the data specified by the atomic write command may be suitably updated.

Summary—Handling Atomic Write Commands

Figure 13:
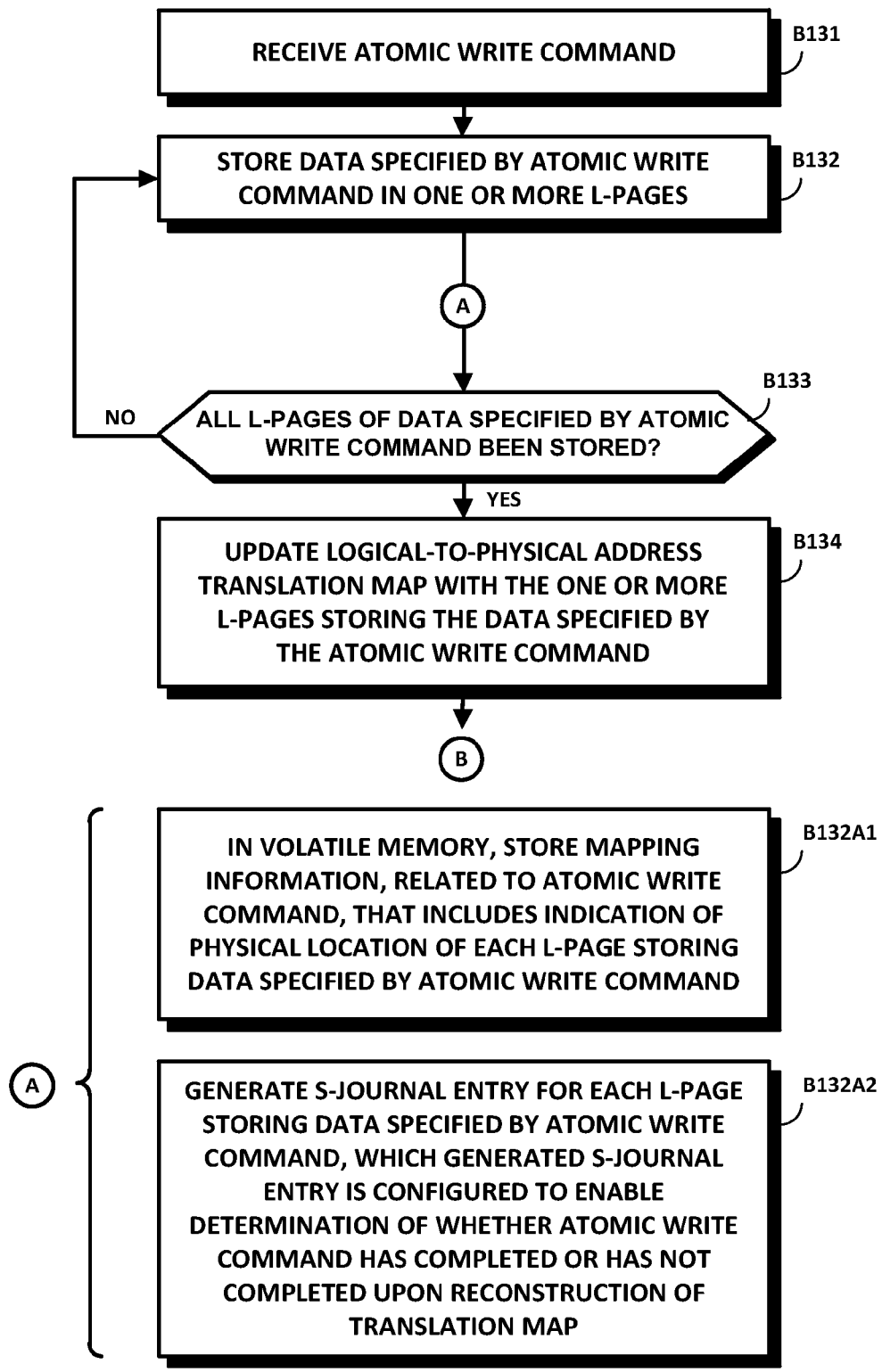
FIG. 13 is a flowchart of a method for processing atomic write commands, according to one embodiment.

FIG. 13 is a flowchart of a method of performing an atomic write command in a data storage device comprising a volatile memory and a plurality of non-volatile memory devices that are configured to store a plurality of physical pages. As shown therein, block B131 calls for receiving an atomic write command, whereupon the data specified by the atomic write command may be stored in one or more L-Pages, as shown at B132. At B133, it may be determined whether all L-Pages of data specified by the atomic write command have been stored in the non-volatile storage devices (e.g., Flash). B132 may be carried out again (NO Branch of B133) until all L-Pages of the atomic write command have, in fact, been stored (YES Branch of B133). This operates to defer updates to the logical-to-physical address translation map until all such L-Pages of the atomic write command have been stored. When all L-Pages of data specified by the atomic write command have been stored, the logical-to-physical address translation map may be updated with the one or more L-Pages storing the data specified by the atomic write command, as shown at B134.

According to one embodiment, blocks B132A1 and B132A2 may be carried out between blocks B132 and B133—that is, prior to updating the logical-to-physical address translation map. As shown at B132A1, mapping information (such as 1108 in FIG. 11, for example) comprising an indication of the physical location of each L-Page storing the data specified by the atomic write command may be stored in volatile memory. Also, for each L-Page storing data specified by the atomic write command, an S-Journal entry may be generated, as shown at B132A2. This generated S-Journal entry may be configured, as shown in FIG. 13, to enable a determination of whether the atomic write command has completed or has not completed upon reconstruction of the logical-to-physical address translation map. Such S-Journal entry, as shown in FIG. 12, may comprise an L-Page and an indication of the atomic sequence number and the slot number where such sequence number is stored. In one embodiment, the header of an L-Page written by an atomic write command contains the same atomic sequence number and slot number information. This allows for reconstruction even if the corresponding S-Journal entry is not written. The reconstruction process is configured in one embodiment to process L-Pages for which no journal entries were found, and use the header information in those L-Pages to rebuild the mapping table.

Figure 14:
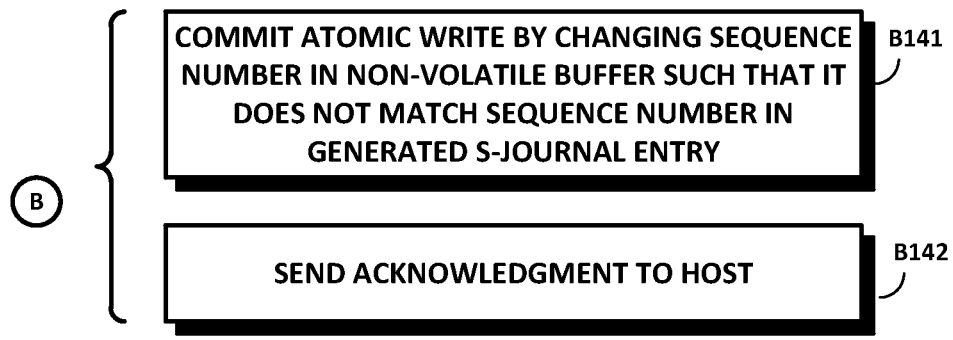
FIG. 14 is a flowchart of further aspects of a method for processing atomic write commands, according to one embodiment.

As shown in FIG. 14, the atomic write may be committed by changing the atomic sequence number in the power-safe temporary storage (e.g., 211 in FIG. 2) such that the changed atomic sequence number does not match the atomic sequence number in the generated S-Journal entry or entries for that atomic write command, as show at B141. Thereafter, the atomic write command may be considered to have been completed and an atomic write complete acknowledgement is sent to the host, as shown at B142.

Conclusion

While certain embodiments of the disclosure have been described, these embodiments have been presented by way of example only, and are not intended to limit the scope of the disclosure. Indeed, the novel methods, devices and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. For example, those skilled in the art will appreciate that in various embodiments, the actual physical and logical structures may differ from those shown in the figures. Depending on the embodiment, certain steps described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method of performing an atomic write command in a data storage device comprising a volatile memory and a plurality of non-volatile memory devices that are configured to store a plurality of physical pages, the method comprising:
    storing data in a plurality of logical pages (L-Pages), each of the plurality of L-Pages being associated with a logical address;
    maintaining a logical-to-physical address translation map in the volatile memory, the translation map being configured to enable determination of a physical location, within one or more of the physical pages, of the data referenced by each logical address;
    receiving the atomic write command;
    maintaining, in the plurality of non-volatile memory devices, a plurality of system journals (S-Journals) defining physical-to-logical address correspondences, each journal comprising a plurality of system journal entries, each entry configured to associate the one or more physical pages to an L-Page;
    storing data specified by the atomic write command in at least one L-Page, the storing further comprising generating an S-Journal entry for each of the at least one L-Page storing data specified by the atomic write command, the generated S-Journal entry being configured to enable a determination of whether the atomic write command was completed or not completed upon reconstruction of the translation map; and
    deferring an update to at least one entry in the translation map associated with the at least one L-Page storing the data specified by the atomic write command until all L-Pages storing data specified by the atomic write command have been written in a power-safe manner.

2. The method of claim 1, wherein storing data specified by the atomic write command comprises:
    storing, in the volatile memory, mapping information related to the atomic write command, the mapping information including an indication of the physical location of each L-Page storing the data specified by the atomic write command.

3. The method of claim 2, further comprising:
    after all L-Pages storing the data specified by the atomic write command are written, updating the at least one entry in the translation map associated with the at least one L-Page with the indication of the physical location.

4. The method of claim 3, further comprising:
    acknowledging a completion of the atomic write command to a host coupled to the data storage device after the translation map has been updated.

5. The method of claim 2, wherein the translation map is configured to store mapping entries spanning at least a portion of a logical capacity of the data storage device and wherein the mapping information for the atomic write command includes one or more logical addresses that extend beyond the logical capacity of the data storage device.

6. The method of claim 2, wherein the mapping information for the atomic write command is stored separately from the translation map.

7. The method of claim 1, wherein each S-Journal entry for the atomic write command comprises one of a plurality of unique sequence numbers and an indication of a physical location, within the non-volatile memory devices, of one L-Page storing data specified by the atomic write command.

8. The method of claim 7, further comprising writing the sequence number and the indication of physical location that is part of the S-Journal entry in a header associated with the one L-Page.

9. The method of claim 7, further comprising generating the unique sequence number, wherein each sequence number generated is configured to be non-repeating.

10. The method of claim 7, further comprising providing a plurality of slots in a power-safe temporary storage, each slot being configured to store one of the plurality of unique sequence numbers.

11. The method of claim 10, wherein each slot is not used for consecutive sequence numbers.

12. The method of claim 10, further comprising:
    saving a unique sequence number for a current or next atomic write command in the power-safe temporary storage.

13. The method of claim 12, further comprising one of changing, in the power-safe temporary storage, the unique sequence number associated with the atomic write command after the atomic write command is completed and before acknowledging the completion of the atomic write command to a host coupled to the data storage device.

14. The method of claim 12, further comprising determining whether an atomic write command has completed during reconstruction of the translation map by comparing the unique sequence number stored in the S-Journal entry with the unique sequence number stored in the power-safe temporary storage.

15. The method of claim 14, wherein a match between the unique sequence number stored in the S-Journal entry and the unique sequence number stored in the power-safe temporary storage indicates an incomplete atomic write command.

16. The method of claim 10, wherein the power-safe temporary storage comprises one of a magnetic random access memory (MRAM), a battery-backed random access memory and a non-volatile random access memory (NVRAM).

17. The method of claim 1, further comprising:
deferring free space accounting until after all L-Pages storing data specified by the atomic write command have been stored in the non-volatile memory devices and the atomic write command is determined to have completed.

18. The method of claim 1, further comprising:
receiving a non-atomic write command;
storing data specified by the non-atomic write command in at least one L-Page; and
updating the translation map after each L-Page storing data specified by the non-atomic write command data is written.

19. The method of claim 1, further comprising:
storing information tracking a range of L-Pages in which the writing of at least some L-Pages specified by the atomic write command have been completed;
in the event the atomic write command does not complete, at reconstruction:
using the stored tracking information to generate a copy command that copies a current version of L-Pages within the range that existed before the atomic write command.

20. A data storage device controller, comprising:
a processor, the processor being configured to perform an atomic write command in a data storage device comprising a volatile memory and a plurality of non-volatile memory devices that are configured to store a plurality of physical pages, by at least:
storing data in a plurality of logical pages (L-Pages), each of the plurality of L-Pages being associated with a logical address;
maintaining a logical-to-physical address translation map in the volatile memory, the translation map being configured to enable determination of a physical location, within one or more of the physical pages, of the data referenced by each logical address;
receiving the atomic write command;
maintaining, in the plurality of non-volatile memory devices, a plurality of system journals (S-Journals) defining physical-to-logical address correspondences, each journal comprising a plurality of system journal entries, each entry configured to associate the one or more physical pages to an L-Page;
storing data specified by the atomic write command in at least one L-Page, the storing further comprising generating an S-Journal entry for each of the at least one L-Page storing data specified by the atomic write command, the generated S-Journal entry being configured to enable a determination of whether the atomic write command was completed or not completed upon reconstruction of the translation map; and
deferring an update to at least one entry in the translation map associated with the at least one L-Page storing the data specified by the atomic write command until all L-Pages storing data specified by the atomic write command have been written in a power-safe manner.

21. The data storage device controller of claim 20, wherein storing data specified by the atomic write command comprises:
storing, in the volatile memory, mapping information related to the atomic write command, the mapping information including an indication of the physical location of each L-Page storing the data specified by the atomic write command.

22. The data storage device controller of claim 21, wherein the processor is further configured to, after all L-Pages storing the data specified by the atomic write command are written, update the at least one entry in the translation map associated with the at least one L-Page with the indication of the physical location.

23. The data storage device controller of claim 22, wherein the processor is further configured to acknowledge a completion of the atomic write command to a host coupled to the data storage device after the translation map has been updated.

24. The data storage device controller of claim 21, wherein the translation map is configured to store mapping entries spanning at least a portion of a logical capacity of the data storage device and wherein the mapping information for the atomic write command includes one or more logical addresses that extend beyond the logical capacity of the data storage device.

25. The data storage device controller of claim 21, wherein the mapping information for the atomic write command is stored separately from the translation map.

26. The data storage device controller of claim 20, wherein each S-Journal entry for the atomic write command comprises one of a plurality of unique sequence numbers and an indication of a physical location, within the non-volatile memory devices, of one L-Page storing data specified by the atomic write command.

27. The data storage device controller of claim 26, wherein the processor is further configured to write the sequence number and the indication of physical location that is part of the S-Journal entry in a header associated with the one L-Page.

28. The data storage device controller of claim 26, wherein the processor is further configured to generate the unique sequence number, wherein each sequence number generated is configured to be non-repeating.

29. The data storage device controller of claim 26, wherein the processor is further configured to provide a plurality of slots in a power-safe temporary storage, each slot being configured to store one of the plurality of unique sequence numbers.

30. The data storage device controller of claim 29, wherein each slot is not used for consecutive sequence numbers.

31. The data storage device controller of claim 29, wherein the processor is further configured to save a unique sequence number for a current or next atomic write command in the power-safe temporary storage.

32. The data storage device controller of claim 31, wherein the processor is further configured to change, in power-safe temporary storage, the unique sequence number associated with the atomic write command after the atomic write command is completed and before acknowledging the completion of the atomic write command to a host coupled to the data storage device.

33. The data storage device controller of claim 31, wherein the processor is further configured to determine whether an atomic write command has completed during reconstruction of the translation map by comparing the unique sequence number stored in the S-Journal entry with the unique sequence number stored in the power-safe temporary storage.

34. The data storage device controller of claim 33, wherein a match between the unique sequence number stored in the S-Journal entry and the unique sequence number stored in the power-safe temporary storage indicates an incomplete atomic write command.

35. The data storage device controller of claim 29, wherein the power-safe temporary storage comprises one of a magnetic random access memory (MRAM), a battery-backed random access memory and a non-volatile random access memory (NVRAM).

36. The data storage device controller of claim 20, wherein the processor is further configured to defer free space accounting until after all L-Pages storing data specified by the atomic write command have been stored in the non-volatile memory devices and the atomic write command is determined to have completed.

37. The data storage device controller of claim 20, wherein the processor is further configured to:
- receive a non-atomic write command;
- store data specified by the non-atomic write command in at least one L-Page; and
- update the translation map after each L-Page storing data specified by the non-atomic write command data is written.

38. The data storage device controller of claim 20, wherein the processor is further configured to:
- store information tracking a range of L-Pages in which the writing of at least some L-Pages specified by the atomic write command have been completed;
- in the event the atomic write command does not complete, at reconstruction:
  - use the stored tracking information to generate a copy command that copies a current version of L-Pages within the range that existed before the atomic write command.

39. A data storage device, comprising:
- the volatile memory;
- the plurality of non-volatile memory devices; and
- the data storage device controller of claim 20.

* * * * *